United States Patent [19]

Mikamura

[11] Patent Number: 5,363,064
[45] Date of Patent: Nov. 8, 1994

[54] PREAMPLIFIER FOR OPTICAL COMMUNICATION HAVING A GAIN CONTROL CIRCUIT

[75] Inventor: Yasuki Mikamura, Kanagawa, Japan

[73] Assignee: Sumitomo Electric Industries, Ltd., Osaka, Japan

[21] Appl. No.: 50,621

[22] Filed: Apr. 22, 1993

[30] Foreign Application Priority Data

Apr. 24, 1992 [JP] Japan .................. 4-106682

[51] Int. Cl.$^5$ .............................................. H03F 3/08
[52] U.S. Cl. ............................ 330/308; 250/214 AG; 359/194
[58] Field of Search ................... 250/214 A, 214 AG; 330/59, 110, 308; 359/189, 194

[56] References Cited

U.S. PATENT DOCUMENTS

| | | | |
|---|---|---|---|
| 4,218,613 | 8/1980 | Bletz | 250/214 A |
| 4,620,321 | 10/1986 | Chown | 250/214 A X |
| 4,623,786 | 11/1987 | Rodwell | 250/214 A |
| 4,808,810 | 2/1989 | Van Doorn | 250/214 AG X |
| 5,025,226 | 6/1991 | Taylor | 330/277 |
| 5,030,925 | 7/1991 | Taylor | 330/308 |
| 5,216,386 | 6/1993 | Wyatt | 330/308 |

FOREIGN PATENT DOCUMENTS 0382373  8/1990  European Pat. Off. .

OTHER PUBLICATIONS

Presentation at Autumn National Conference of the Institute of Electronics, Information and Communication Engineers 1990, Yasuki Mikamura et al, B-743, Wide Dynamic Range GaAs Preamplifier IC for Lightwave Transmission.

Presentation at Autumn National conference of the Institute of Electronics, Information and Communication Engineers 1990, S. Inano et al, B-744, High Gain and Broadband GaAs Preamplifer IC's for High Speed Optical Receivers.

IEEE Journal on selected areas in communications, vol. SAC. 1 No. 3. Apr., "Consideration for Optical Receivers Design," Kinichiro Ogawa, Member IEEE. pp. 524–532.

*Primary Examiner*—Steven Mottola
*Attorney, Agent, or Firm*—Cushman, Darby & Cushman

[57] ABSTRACT

A phase-inverting amplifier includes an input-stage FET, a load thereof and a gain control circuit. The gain control circuit is provided in parallel with the load, and reduces an effective load resistance to lower an open-loop gain of the phase-inverting amplifier when a current flowing through the load exceeds a predetermined value. The gain control circuit is typically a FET whose gate is biased at a constant voltage. A feedback resistor is provided in a negative feedback path of the phase-inverting amplifier. A bypass circuit is provided in parallel with the feedback resistor, and reduces an effective feedback resistance when a feedback quantity exceeds a predetermined value.

12 Claims, 7 Drawing Sheets

PREAMPLIFIER FOR OPTICAL COMMUNICATION HAVING A GAIN CONTROL CIRCUIT

BACKGROUND OF THE INVENTION

The present invention relates to a preamplifier for use in optical communication receivers.

In general, a transimpedance-type preamplifier (FIG. 10(a)) and a high-impedance-type preamplifier (FIG. 10(b)) are employed in optical communication receivers. For example, these circuits are described in K. Ogawa, "Considerations for Optical Receiver Design," IEEE Journal on Selected Areas in Communications, Vol. SAC-1, No. 3, 1983, pp. 524–532.

Conventionally, repeaters used in a trunk system of a telephone network, which is the main application field of the optical communication, are required to be highly sensitive to amplify weak signals that have been subjected to attenuation through long-distance transmission while maintaining their waveforms.

On the other hand, in recent years, the application fields of the optical communication have expanded, for instance, to the data communication and subscriber systems. To be applicable to such a variety of communication systems, i.e., to accommodate various light sources, wide-range transmission distance, signal attenuation in optical fibers and communication network topology, etc., the development of an optical communication receiver is now desired which, in addition to being highly sensitive, can deal with optical signals having a wide dynamic range.

In the above circumstances, the present inventor proposed a preamplifier as shown in FIG. 11 (see, for instance, "Wide Dynamic Range GaAs Preamplifier IC for Lightwave Transmission," Autumn National Conference of the Institute of Electronics, Information and Communication Engineers, Presentation No. B-743, 1990). As shown in FIG. 11, a preamplifier A has the transimpedance-type basic constitution, and is incorporated in an optical receiver B that corresponds to the front-end portion of a repeater. The preamplifier A produces an output signal $V_{OUT}$ by amplifying an input signal $V_{IN}$ produced by impedance-conversion of a photocurrent that is an output of a photodetector PD receiving an optical signal hv from a light transmission line. A bypass circuit C is provided to improve the dynamic range. That is, a cascade connection of a transimpedance-type phase-inverting amplifier 1 having a feedback resistor $r_f$ and an output buffer circuit 2 is provided between the input and output terminals of the preamplifier A. The source and drain of a field-effect transistor 3 of the bypass circuit C are connected to the respective terminals of the feedback resistor $r_f$. A voltage in proportion to an output level of the output buffer circuit 2 is applied to the gate of the transistor 3 via a level shift circuit 4.

When the input signal $V_{IN}$ having an excessively large amplitude input signal is input to the preamplifier A, the field effect transistor 3 turns on in response to a variation of the output signal $V_{OUT}$. Therefore, an effective feedback resistance $R_F$ (parallel resistance of the feedback resistance $r_f$ and the transistor 3) decreases to improve the dynamic range.

Referring to FIG. 12, a specific example of the transimpedance-type preamplifier A of FIG. 11 is described in detail. The preamplifier of FIG. 12 consists of compound semiconductor field-effect transistors (hereinafter referred to as FETs) $T_1$–$T_8$ such as GaAs MESFETs, level-shift diode groups $d_1$ and $d_2$, resistors $r_1$ and $r_2$ and a feedback resistor $r_f$, and operates on a single supply voltage $V_{DD}$. The phase-inverting preamplifier 1 is formed by the FETs $T_1$–$T_4$ and the diode groups $d_1$ and $d_2$, the output buffer circuit 2 is formed by the FETs $T_5$ and $T_6$, and the level shift circuit 4 is formed by the FET $T_7$ and the resistors $r_1$ and $r_2$. The feedback resistor $r_f$ and the FET $T_8$ in FIG. 12 correspond to the resistor $r_f$ and the FET 3 in FIG. 10, respectively. The threshold voltage $V_{T8}$ of the FET $T_8$ is $-0.5$ V, and the bias setting is so made that the gate-source voltage $V_{GS}$ of the FET $T_8$ is lower than $-0.5$ V and no current flows between the source and drain when no signal or a very small signal (e.g., smaller than $-20$ dBm) is input.

As the amplitude of the input signal $V_{IN}$ increases in response to the rise of the input optical signal intensity, the voltage level of the output signal $V_{OUT}$ decreases as a result of the phase-inverting amplification and both of the gate voltage $V_G$ and the source voltage $V_S$ of the FET $T_8$ decrease. Since the source voltage $V_s$ drops more than the gate voltage $V_G$, the gate-source voltage $V_{GS}$ increases. As a result, when the input optical signal intensity exceeds a certain value (e.g., $-10$ dBm), the FET $T_8$ turns on to reduce the transimpedance. Even if the amplitude of the input signal $V_{IN}$ is further increased, the reduction of the transimpedance causes clipping of voltage variations within the preamplifier. Therefore, the respective FETs $T_1$–$T_7$ are not so biased as to work in the non-saturation region, which means the increase of the maximum allowable input level (maximum allowable amplitude of the input signal $V_{IN}$). That is, the preamplifier of FIGS. 11 and 12 can increase the dynamic range by raising the maximum allowable input level.

On the other hand, in the preamplifier described above, the feedback resistor $r_f$ needs to have a large value to lower the minimum sensible light intensity within the dynamic range. That is, since the thermal noise $<i_{RF}^2>$ decreases as the feedback resistance $r_f$ increases (see equation (1) below), the minimum sensible light intensity can be lowered.

$$<i_{RF}^2> = \frac{4kTW}{R_F} \quad (1)$$

where $R_F$ is the effective feedback resistance between the input and output of the amplifier 1, W is a frequency bandwidth of the preamplifier, T is the temperature and k is the Boltzmann constant.

However, as is seen from equation (2) belows simply increasing the effective feedback resistance $R_F$ causes a problem that a frequency bandwidth $\omega_C$ of the optical receiver B is reduced.

$$\omega_c = \frac{1 + G}{R_F C_T} \quad (2)$$

where G is an open-loop gain of the amplifier 1, $C_T$ is an input capacitance, and $R_F$ is the effective feedback resistance.

Therefore, as is understood from equation (2), the open-loop gain G of the amplifier 1 needs to be increased or the input capacitance needs to be decreased to provide the large effective resistance $R_F$ (for the improvement of the minimum sensible light intensity)

and secure the sufficiently wide bandwidth $\omega_C$ of the optical receiver B.

The present inventor proposed a preamplifier shown in FIG. 13 which can increase the open-loop gain G (see, for instance, "High Gain and Broadband GaAs Preamplifier IC's for High Speed Optical Receivers," Autumn National Conference of the Institute of Electronics, Information and Communication Engineers, Presentation No. B-744, 1990). The open-loop gain is increased by employing a current-injection-type circuit using FETs having two different threshold voltages. The preamplifier of FIG. 13 has the basic constitution in which a FET $T_{IN}$ for current injection is provided between the drain of the input-stage FET $T_1$ and the supply voltage $V_{DD}$ of the preamplifier of FIG. 12, and a FET $T_{IS}$ is added to isolate the FET $T_{IN}$ from the FET $T_2$ serving as a load. The feedback resistor $r_f$ is provided between the input and output terminals.

In the preamplifier of FIG. 13, the open-loop gain G is increased by current injection from the current injection FET $T_{IN}$ to the input-stage FET $T_1$, to a large value of about 33 dB. However, according to the general principle of constant gain-bandwidth product, the bandwidth $\omega_C$ decreases, to about 600 MHz, compared to the case of not incorporating the measure for increasing the gain G (e.g., the preamplifier of FIG. 12).

To cope with this problem, a preamplifier of FIG. 14 was developed by combining the advantages of the first conventional preamplifier of FIGS. 11 and 12 which can increase the maximum allowable input level by incorporation of the bypass circuit C and the second conventional preamplifier of FIG. 13 which can lower the minimum sensible light intensity.

However, this simple combination could not provide an optimum preamplifier because the following problems actually occurred. In the preamplifier of FIG. 14, the bypass circuit is formed by adding a switching diode $d_S$ (corresponding to the FET $T_8$ in FIG. 12) to the preamplifier of FIG. 13 having the current injection FET $T_{IN}$. If the frequency characteristic of the preamplifier has a first-order pole, a transimpedance transfer function $Z_T(s)$ of an optical receiver including it has a second-order pole and is therefore expressed by equation (3) where $\omega_C$ is an angular frequency bandwidth of the optical receiver, $G_O$ is a d.c. open-loop gain of the preamplifier, $\omega_h$ is an angular frequency bandwidth of the preamplifier, $R_F$ is an effective feedback resistance (i.e., a parallel resistance of the feedback resistor $r_f$ and the switching diode $d_S$), and $C_T$ is an input capacitance of the preamplifier.

$$Z_T(s) = \frac{Z_{Tdc}}{1 + \frac{2\zeta s}{\omega_c} + \frac{s^2}{\omega_c^2}} \quad (3)$$

where $$G(s) = \frac{G_0}{1 + \frac{s}{\omega_h}}$$

$$Z_{Tdc} = \frac{R_F G_0}{1 + G_0}$$

$$\omega_c = \sqrt{\frac{(1 + G_0)\omega_h}{C_T R_F}}$$

$$\zeta = (1 + C_T R_F \omega_h)\sqrt{\frac{(1 + G_0)\omega_h}{4 C_T R_F}} \quad (4)$$

The problems occur in the following manner. When an excessively large input signal $V_{IN}$ comes in, the bypass circuit operates to reduce the effective feedback resistance $R_F$, which means decrease of $\zeta$ in equation (3). Since the decrease of $\zeta$ means increase of the feedback quantity, the bandwidth $\omega_C$ of the optical receiver increases to become close to the upper limit of the bandwidth $\omega_h$ of the preamplifier as the input signal $V_{IN}$ further increases to further reduce $\zeta$, as seen from equation (2). In this situation, a condition $\omega_C \geq \omega_h$ is more likely to be established than in the first conventional case, because, as described above, the bandwidth $\omega_h$ of the preamplifier whose gain is increased by the current injection is narrower than the first conventional preamplifier of FIG. 12. As a result, as is understood from equation (3), the optical receiver exhibits a peaking-type transimpedance characteristic as shown in FIG. 15(a) and its operation becomes unstable.

With the peaking-type characteristic, a rectangular NRZ (non-return-to-zero) optical signal will cause ringing or oscillation (FIG. 15(b)), so that the output signal $V_{OUT}$ will not assume a waveform faithful to the input signal waveform. In an actual measurement (see FIG. 16), an output signal $V_{OUT}$ having a waveform distortion associated with an oscillation phenomenon was observed in response to a NRZ input optical signal having an average light intensity of $-10$ dBm and a pulse rate of 622 Mbit/sec.

In summary, when the input signal $V_{IN}$ is not too large, the bandwidth $\omega_h$ of the preamplifier is sufficiently larger than the bandwidth $\omega_C$ of the optical receiver ($\omega_h > \omega_C$) and the stable operation is obtained. However, when the amplitude of the input signal $V_{IN}$ becomes too large, $\omega_C$ increases to become close to $\omega_h$ or to exceed it, in which case the optical receiver becomes unstable and exhibits, for instance, an oscillation.

SUMMARY OF THE INVENTION

The present invention has been made in view of the above problems in the art, and has an object of providing a preamplifier for optical communication which can increase the frequency bandwidth and the dynamic range at the same time.

According to the invention, a preamplifier for optical communication that amplifies an input signal produced by a photodetector, comprises:

a phase-inverting amplifier including an input-stage FET and a load thereof, for amplifying the input signal;

gain control means for reducing an effective load resistance to lower an open-loop gain of the phase-inverting amplifier when a current flowing through the load exceeds a first predetermined value;

a feedback resistor provided in a negative feedback path of the phase-inverting amplifier; and bypass means for reducing an effective feedback resistance when a feedback quantity exceeds a second predetermined value.

With the above constitution, when the input signal is small, the open-loop gain of the phase-inverting amplifier is large and the effective feedback resistance is large, so that the preamplifier exhibits a higher light-receiving sensitivity.

On the other hand, when the input signal exceeds a predetermined amplitude, the effective feedback resistance is reduced to increase the maximum allowable input level. Although the effective load resistance is reduced and the open-loop gain of the phase-inverting amplifier is thereby lowered, the bandwidth of the phase-inverting amplifier is increased to always assure a condition that the bandwidth of the phase-inverting amplifier is larger than the bandwidth of the optical receiver. As a result, undesired phenomena such as oscillation and ringing can be prevented.

DESCRIPTION OF THE PREFERRED EMBODIMENTS

Figure 1:
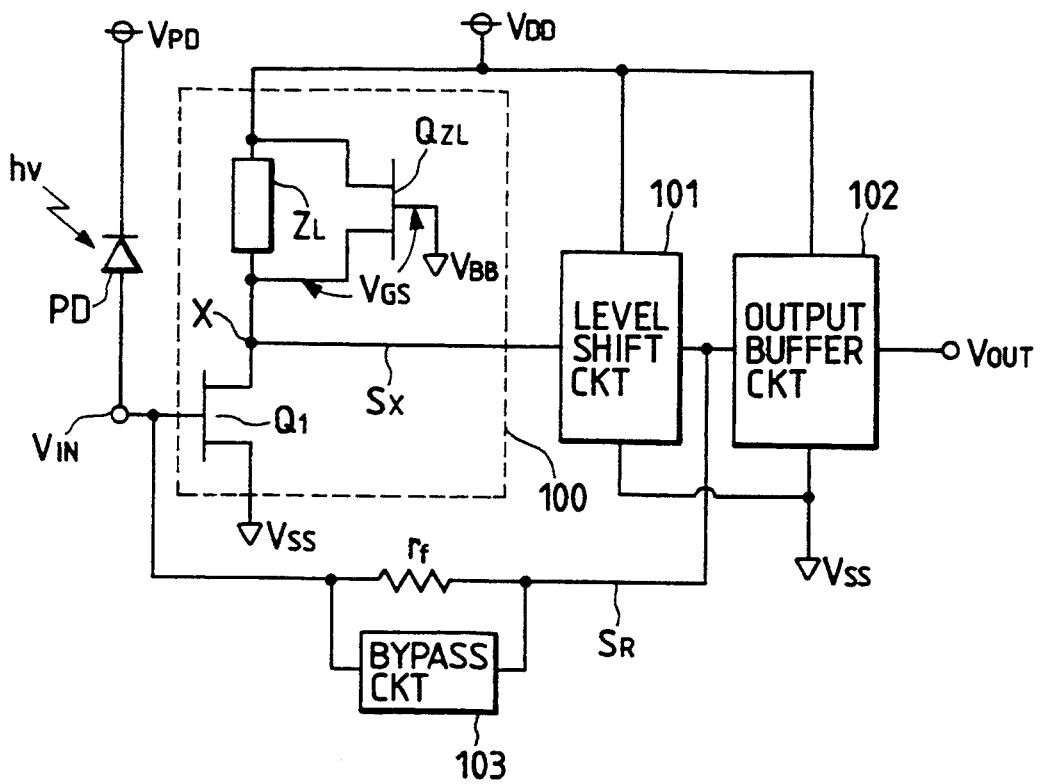
FIG. 1 is a circuit diagram showing a generally concept of a preamplifier according to the present invention.

FIG. 1 is a circuit diagram showing the general constitution of a preamplifier according to the invention. An optical signal h $v$ transmitted through an optical transmission line is detected by a photodetector PD such as a photodiode, and a resultant photocurrent is impedance-converted to an input signal $V_{IN}$, which is applied to the gate of a FET $Q_1$. The source of the FET $Q_1$ is connected to a low supply voltage $V_{SS}$ and its drain is connected to a high supply voltage $V_{DD}$ via a load resistor $Z_L$ having a fixed value. A gain control means is provided in parallel with the load resistor $Z_L$. More specifically, the gain control means consists of a FET $Q_{ZL}$ whose source and drain are connected to the respective terminals of the load resistor $Z_L$, and a d.c. voltage $V_{BB}$ for biasing the gate of the FET $Q_{ZL}$. A first-stage amplifier 100 is constituted of the FETs $Q_1$ and $Q_{ZL}$, load resistor $Z_L$ and d.c. voltage $V_{BB}$. A signal $S_x$ appearing at the drain X of the FET $Q_1$ is shifted to a proper bias level by a level shift circuit 101, and fed back to the gate of the FET $Q_1$ via a feedback resistor $r_f$. A bypass circuit 103 is provided in parallel with the feedback resistor $r_f$. An output buffer circuit 102 power-amplifies the output of the level shift circuit 101 to produce an output signal $V_{OUT}$. The resistance of the bypass circuit 103 changes in accordance with the output level of the level shift circuit 101 to automatically adjust an effective feedback resistance $R_F$ (parallel resistance of the feedback resistor $r_f$ and the bypass circuit 103).

Figure 2:
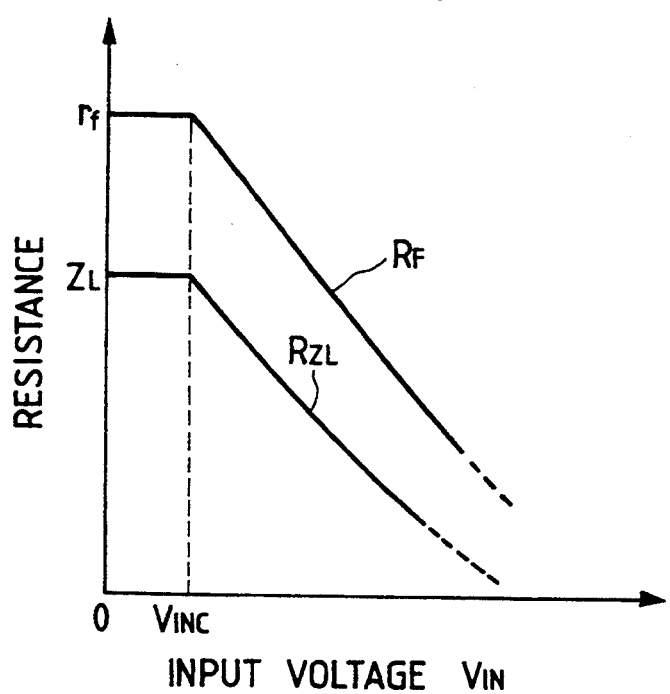
FIG. 2 is a graph showing operation of the preamplifier of FIG. 1.

With additional reference to FIG. 2, the operation of the preamplifier of FIG. 1 is described below. Since the first-stage amplifier 100 is a phase-inverting amplifier, the input signal $V_{IN}$ is amplified, with phase inversion, to produce the signal $S_X$ at the drain of the FET $Q_1$.

When the input signal $V_{IN}$ has a small amplitude, a d.c. variation of the output $S_R$ of the level shift circuit 101 is small. Therefore, the bypass circuit 103 is kept open, and the effective feedback resistance $R_F$ is equal to the feedback resistance $r_f$. With the large feedback resistance $r_f$, a sufficiently high light-receiving sensitivity is obtained when the input signal $V_{IN}$ is very small or has a small amplitude.

When the input signal $V_{IN}$ exceeds a predetermined amplitude $V_{INC}$ and the output $S_R$ of the level shift circuit 101 thereby exceeds a preset threshold of the bypass circuit 103, the internal resistance of the bypass circuit 103 decreases, so that the effective feedback resistance $R_F$ becomes smaller than the feedback resistance $r_f$. Therefore, even when a large input signal $V_{IN}$ comes in, voltage variations in the preamplifier are clipped to prevent the internal active devices from being biased to operate in the non-saturation region. As a result, the maximum allowable input level can be increased.

As the amplitude of the input signal $V_{IN}$ increases, the voltage at the drain X of the FET $Q_1$ decreases. The source voltage of the FET $Q_{ZL}$ decreases accordingly and its gate-source voltage $V_{GS}$ increases. Therefore, when the input signal $V_{IN}$ exceeds the predetermined amplitude and the gate-source voltage $V_{GS}$ of the FET $Q_{ZL}$ exceeds a threshold voltage $V_{TZL}$, the FET $Q_{ZL}$ turns on to gradually reduce an effective load resistance $R_{ZL}$ (parallel resistance of the load resistance $Z_L$ and the FET $Q_{ZL}$). As a result, when a large amplitude input signal $V_{IN}$ comes in, the open-loop gain of the first-stage amplifier 100 decreases but its bandwidth $\omega_h$ increases, so that undesired phenomena such as oscillation and ringing can be prevented. That is, in equation (4), the parameter $\zeta$ does not decrease because the increase of the bandwidth $\zeta_h$ of the amplifier 100 compensates for the decrease of the effective feedback resistance $R_F$. Even if the bandwidth $\omega_C$ of the optical receiver increases according to equation (2), the bandwidth $\omega_h$ of the preamplifier increases to always satisfy the relationship $\omega_C < \omega_h$ to thereby assure stable operation of the optical receiver.

In summary, when the input signal $V_{IN}$ has an amplitude smaller than the predetermined value, the effective feedback resistance $R_F$ is kept large to lower the minimum sensible light intensity. When the input signal $V_{IN}$ takes a large amplitude, the effective feedback resistance $R_F$ decreases to increase the maximum allowable input level, and the bandwidth $\omega_h$ of the amplifier 100 increases to prevent unstable operation such as oscillation.

Figure 12:
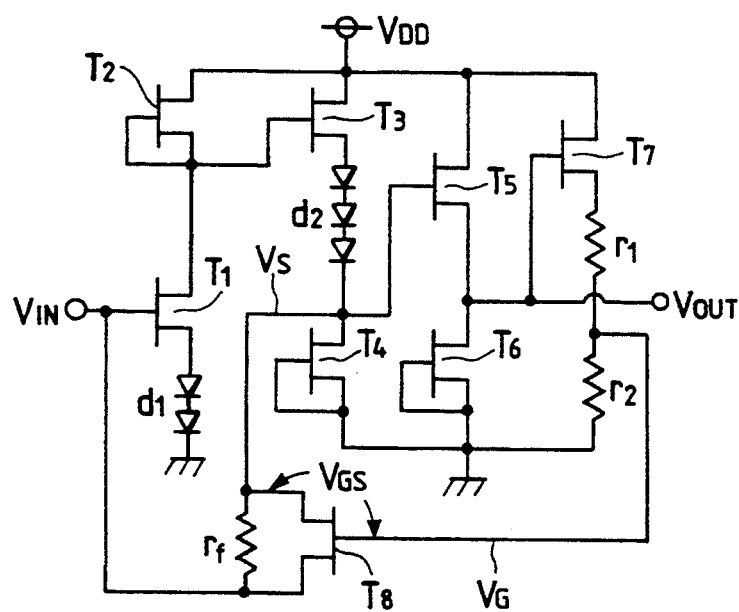
FIG. 12 is a circuit diagram showing specific constitution of the preamplifier of FIG. 11.
Figure 13:
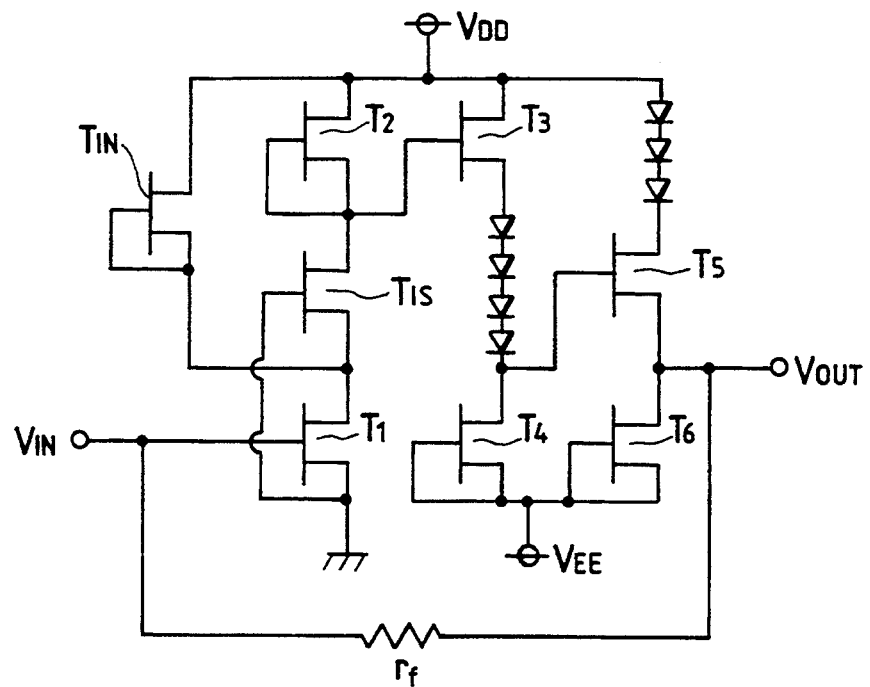
FIG. 13 is a circuit diagram showing a second conventional preamplifier.
Figure 14:
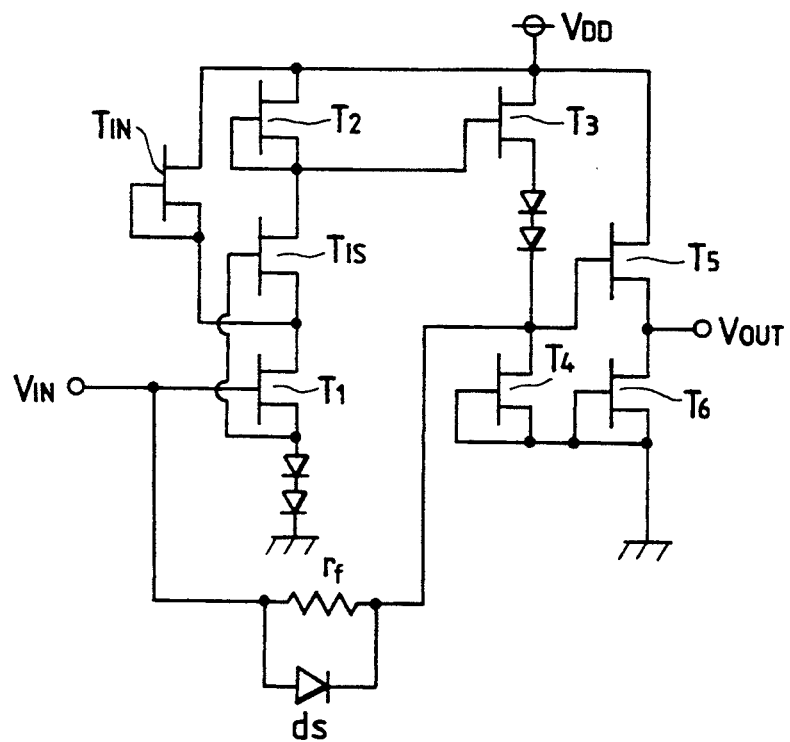
FIG. 14 is a circuit diagram showing a third conventional preamplifier.
Figure 15A:
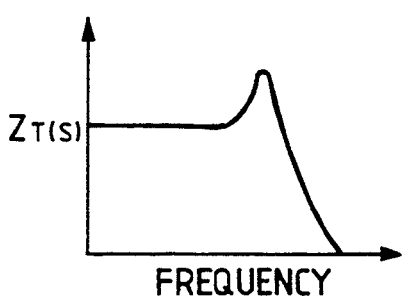
FIGS. 15(a) and 15(b) are graphs showing problems of the preamplifier of FIG. 14.
Figure 15B:
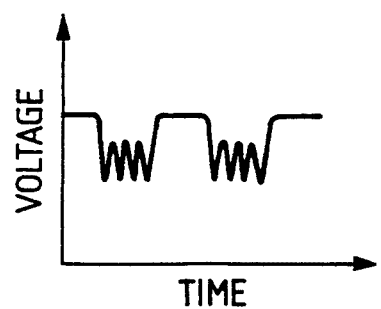
Figure 16:
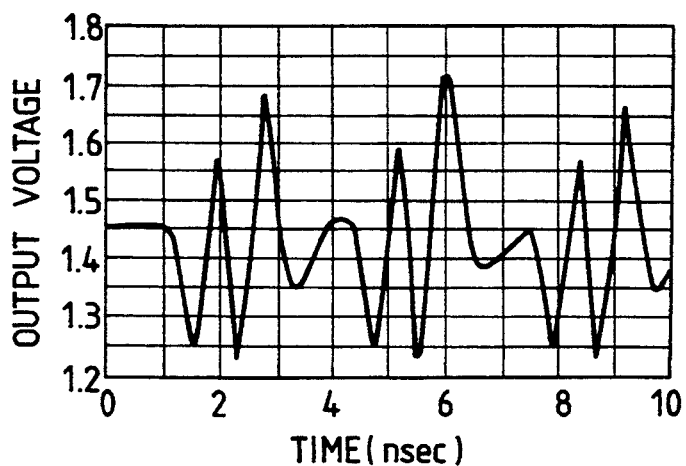
FIG. 16 is a waveform showing a problem of the preamplifier of FIG. 14.
Figure 17:
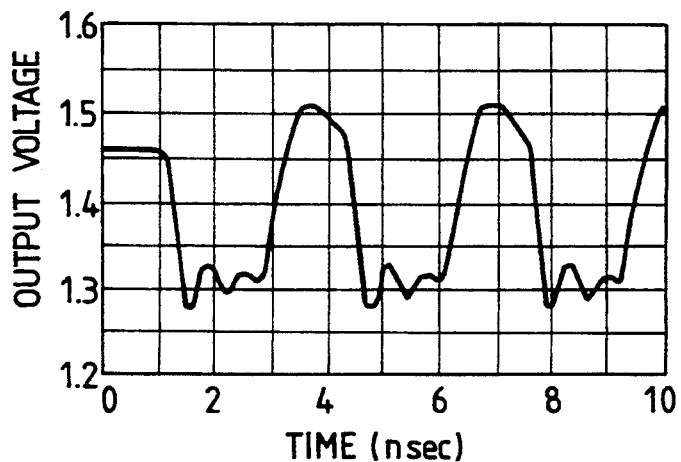
FIG. 17 is a waveform of an output signal of the preamplifier of FIG. 1.

A measurement was performed by applying, to the preamplifier of FIG. 1, the same NRZ rectangular input signal $V_{IN}$ as applied to the conventional preamplifier of FIG. 12. As shown in FIG. 17, a waveform of the output signal $V_{OUT}$ has no oscillation and is faithful to the input signal $V_{IN}$, and is clearly improved from the waveform of FIG. 16.

Figure 3:
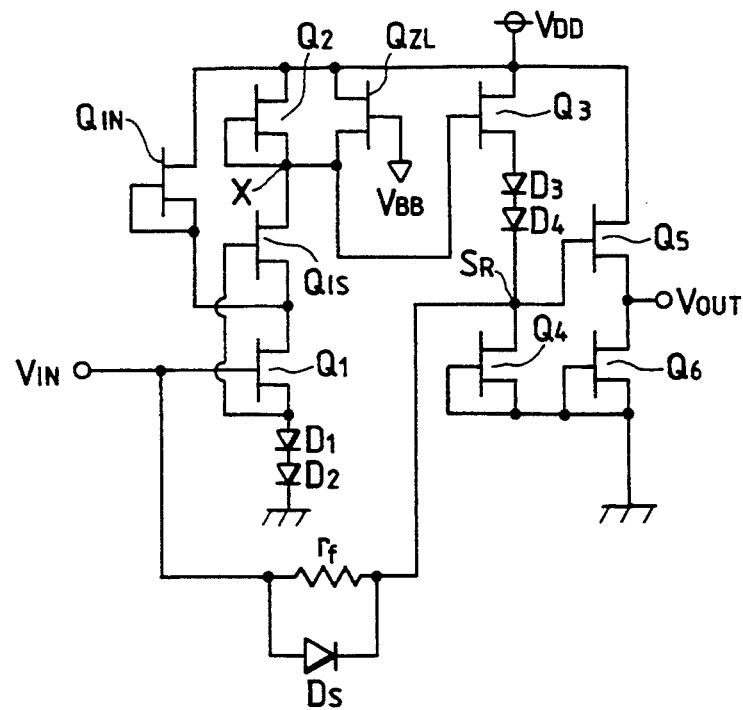
FIG. 3 is a circuit diagram showing a preamplifier according to a first embodiment of the invention.

Referring to FIG. 3, a first specific embodiment is described below. A preamplifier of this embodiment consists of a first-stage amplifier formed by FETs $Q_1$, $Q_{IS}$, $Q_{IN}$, $Q_2$ and $Q_{ZL}$ and bias-setting diodes $D_1$ and $D_2$, a level shift circuit formed by FETs $Q_3$ and $Q_4$ and diodes $D_3$ and $D_4$, an output buffer circuit formed by FETs $Q_5$ and $Q_6$, a diode $D_S$ as a bypass circuit, and a feedback resistor $r_f$ having a high resistance.

The input signal $V_{IN}$ is applied to the gate of the FET $Q_1$. The bias-setting diodes $D_1$ and $D_2$ are connected to the source of the FET $Q_1$, and the FET $Q_2$ serving as a load is connected to the drain of the FET $Q_1$ via the FET $Q_{IS}$. Further, the FET $Q_{IN}$ for current injection is connected to the drain of the FET $Q_1$, and the FET $Q_{ZL}$, whose gate is biased at a predetermined voltage $V_{BB}$, is connected to the load FET $Q_2$. The source terminal X of the FET $Q_2$ is connected to the gate of the FET $Q_3$. A signal $S_R$ after the level shifting by the diodes $D_3$ and $D_4$ is power-amplified by the FET $Q_5$ having the source-follower connection to become an output signal $V_{OUT}$. The signal $S_R$ is also fed back to the gate of the FET $Q_1$ via the feedback resistor $r_f$ and the diode $D_S$.

In this embodiment, when the input signal $V_{IN}$ has a small amplitude, the FET $Q_{ZL}$ is in an off-state, because it is so biased that its gate-source voltage $V_{GS}$ is lower than the threshold voltage $V_{TZL}$. Therefore, the effective load resistance $R_{ZL}$ for the FET $Q_1$ takes a large value determined by the FET $Q_2$. A resultant large open-loop gain contributes to the improvement of the minimum sensible light intensity. Since the cathode-anode voltage of the diode $D_S$ does not reach its on-voltage, the effective feedback resistance $R_F$ is equal to the feedback resistance $r_f$, which also contributes to the improvement of the minimum sensible light intensity.

On the other hand, when the input signal $V_{IN}$ is large, the voltage at the source terminal X of the FET $Q_2$ take a low value and the gate-source voltage $V_{GS}$ of the FET $Q_{ZL}$ is higher than its threshold voltage $V_{TZL}$. Therefore, the FET $Q_{ZL}$ is in an on-state, and the effective load resistance $R_{ZL}$ for the FET $Q_1$ takes a smaller value. Further, since the diode $D_S$ is in an on-state, the effective feedback resistance $R_F$ is smaller than the feedback resistance $r_f$. Therefore, as in the case of FIG. 1, while the open-loop gain of the preamplifier decreases, its bandwidth $\omega_h$ increases. As a result, the maximum allowable input level is increased without causing an unstable operation such as an oscillation.

Figure 4:
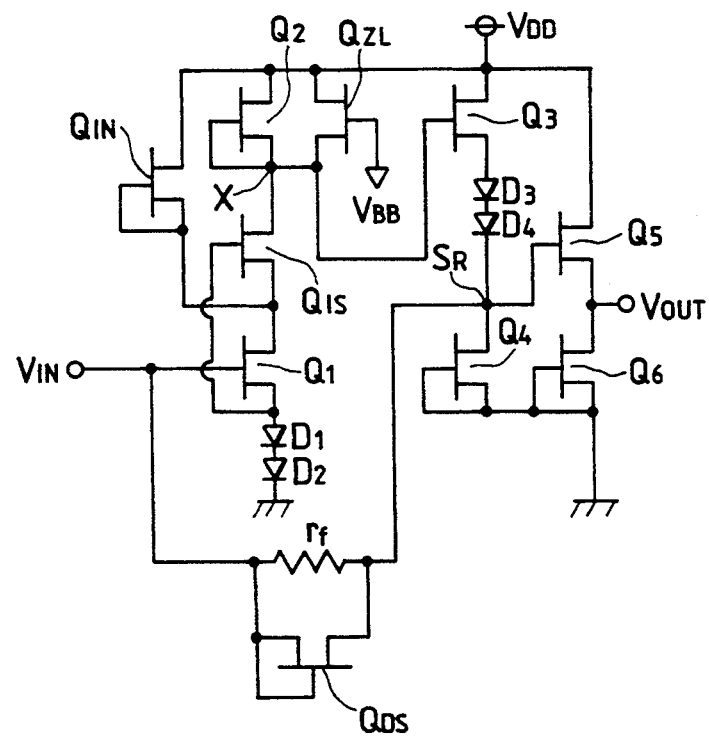
FIG. 4 is a circuit diagram showing a preamplifier according to a second embodiment of the invention.

Referring to FIG. 4, a second specific embodiment is described below. The parts in FIG. 4 that are the same as or equivalent to those in FIG. 3 are given the same reference symbols. The second embodiment is different from the first embodiment in that instead of the diode $D_S$ as the bypass circuit, the drain and source of an enhancement-type FET $Q_{DS}$ whose gate and drain are short-circuited are connected to the respective terminals of the feedback resistor $r_f$. The FET has the same functions as the diode $D_S$ in FIG. 3. That is, the FET $Q_{DS}$ is off when the input signal $V_{IN}$ is small, and is on and serves to reduce the effective feedback resistance $R_F$ when the input signal $V_{IN}$ is larger than the predetermined value. Therefore, like the first embodiment, the second embodiment can provide a preamplifier that has a wide dynamic range and operates stably.

Figure 5:
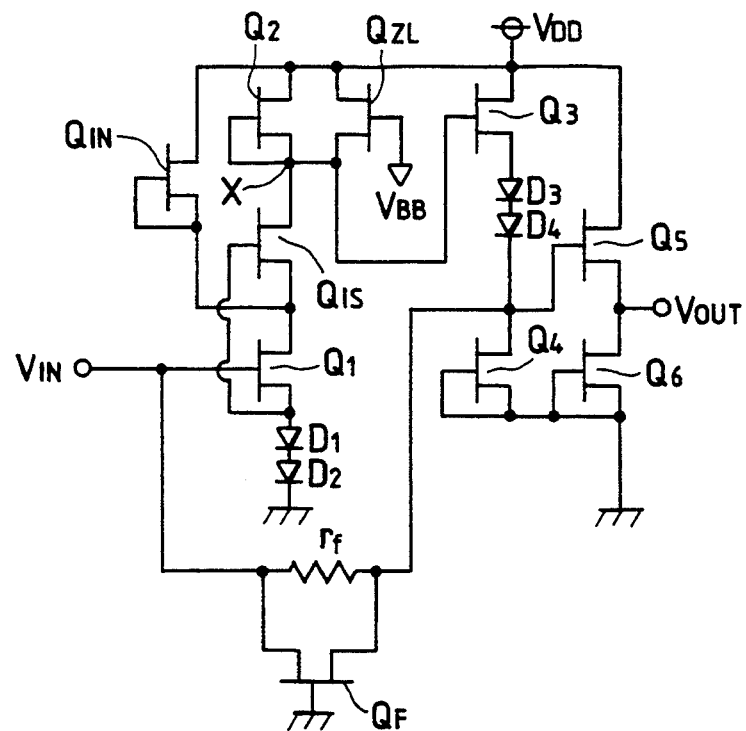
FIG. 5 is a circuit diagram showing a preamplifier according to a third embodiment of the invention.

Referring to FIG. 5, a third specific embodiment is described below. The parts in FIG. 5 that are the same as or equivalent to those in FIG. 3 are given the same reference symbols. The third embodiment is different from the first embodiment in that instead of the diode $D_S$ serving as the bypass circuit, a depletion-type FET $Q_F$ is provided in parallel with the feedback resistor $r_f$. That is, the drain of the FET $Q_F$ is connected to the gate of the input-side FET $Q_1$, its source is connected to the drain of the FET $Q_4$ of the level shift circuit, and its gate is grounded. When the input signal $V_{IN}$ is small, the FET $Q_F$ is in an off state, because its gate-source voltage is lower than the threshold voltage. When the $V_{IN}$ exceeds the predetermined value and the gate-source voltage exceeds the threshold voltage, the FET $Q_F$ is turned on. Therefore, as in the case of the first embodiment, the minimum sensible light intensity is lowered and the maximum allowable input level is increased. That is, the third embodiment can also provide a preamplifier that has a wide dynamic range and operates stably.

Figure 6:
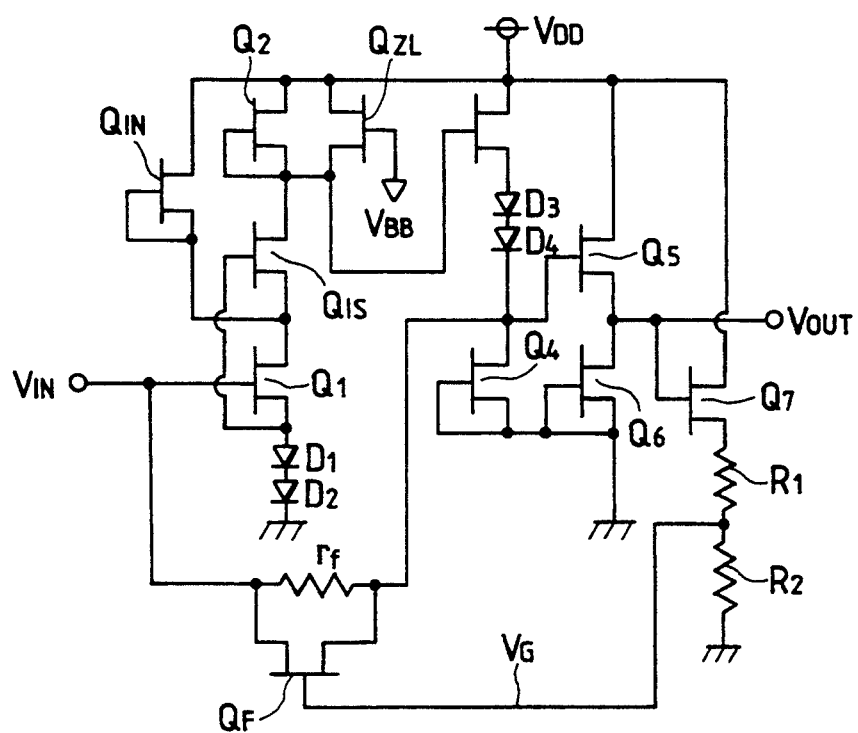
FIG. 6 is a circuit diagram showing a preamplifier according to a fourth embodiment of the invention.

Referring to FIG. 6, a fourth specific embodiment is described below. The parts in FIG. 6 that are the same as or equivalent to those in FIG. 5 are given the same reference symbols. The fourth embodiment is different from the third embodiment in that a voltage divider formed by a FET $Q_7$ and resistors $R_1$ and $R_2$ is connected to the output terminal where the output signal $V_{OUT}$ appears. The gate bias of the depletion-type FET $Q_F$ is set by a divided voltage $V_G$ of the output signal $V_{OUT}$. That is, the gate of the FET $Q_7$ is connected to the output terminal, its drain is connected to the supply voltage $V_{DD}$, and its source is grounded via the resistors $R_1$ and $R_2$. The divided voltage $V_G$ produced by the resistors $R_1$ and $R_2$ is applied to the gate of the FET $Q_F$. The resistances of the resistors $R_1$ and $R_2$ are so set that the gate bias voltage of the FET $Q_F$ is always lower than its source bias voltage. Since, as in the case of the third embodiment, the FET $Q_F$ is automatically switched between the on-state and off-state in accordance with the amplitude of the input signal $V_{IN}$, the minimum sensible light intensity is lowered and the maximum allowable input level is increased. Thus, the preamplifier has a wide dynamic range and operates stably.

In general, due to variations in their manufacturing process, semiconductor devices have variations in their characteristics. Therefore, in the third embodiment of FIG. 5 where the gate of the FET $Q_F$ is grounded, the condition of its switching between the on-state and off-state varies with its threshold voltage. In contrast, in the fourth embodiment of FIG. 6 where the divided voltage $V_G$ by the resistors $R_1$ and $R_2$ is applied to the gate of the FET $Q_F$, variations in the related devices originating from their manufacturing process cancel out each other, so that the switching condition of the FET $Q_F$ can be stabilized.

Figure 7:
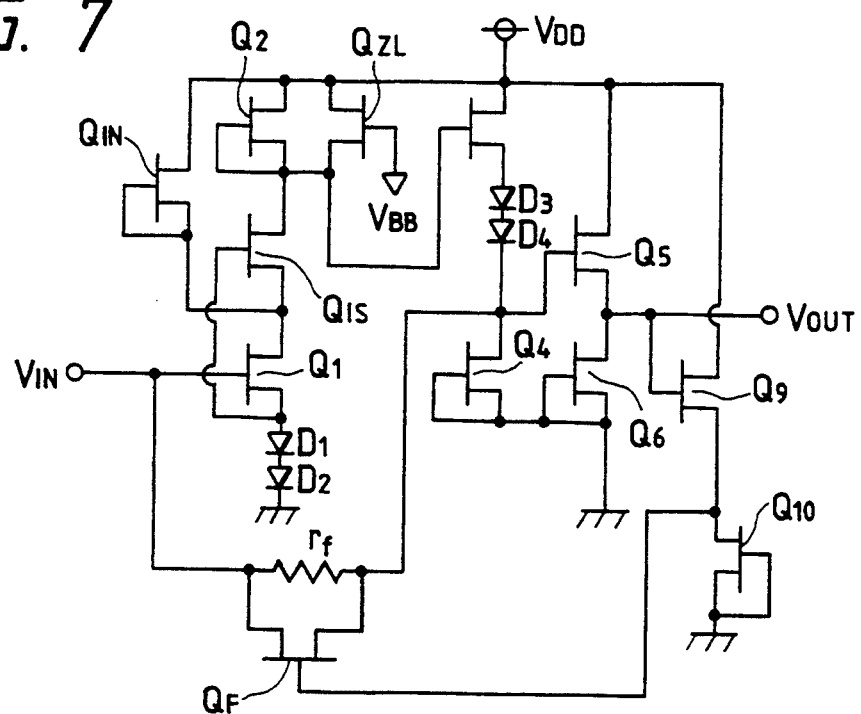
FIG. 7 is a circuit diagram showing a preamplifier according to a fifth embodiment of the invention.

Referring to FIG. 7, a fifth specific embodiment is described below. The parts is FIG. 7 that are the same as or equivalent to those in FIG. 6 are given the same reference symbols. The fifth embodiment is different from the fourth embodiment in the following points. The gate of a FET $Q_9$ is connected to the output terminal where the output voltage $V_{OUT}$ appears, and the drain of a FET $Q_{10}$ is connected to the source of the FET $Q_9$. The gate and source of the FET $Q_{10}$ are short-circuited and grounded. A voltage appearing at the drain of the FET $Q_{10}$ serves as a gate bias for the FET $Q_F$.

Since the FET $Q_{10}$ operates merely as a resistor, the same function as the fourth embodiment can be obtained with smaller devices than the case of the voltage division by resistors.

Figure 8:
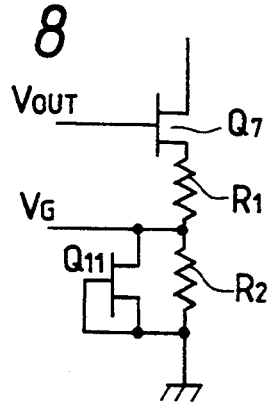
FIG. 8 is a partial circuit diagram showing a preamplifier according to a sixth embodiment of the invention.

FIG. 8 is a partial circuit diagram showing a sixth specific embodiment. This embodiment is different from the fourth embodiment (FIG. 6) only in that an FET $Q_{11}$ is added in parallel with the resistor $R_2$. By employing the FET $Q_{11}$ that is of the same type as the bypass FET $Q_F$, characteristics variations of the FETs $Q_{11}$ and $Q_F$ due to a temperature change or variations in their manufacturing process cancel out each other.

Figure 9:
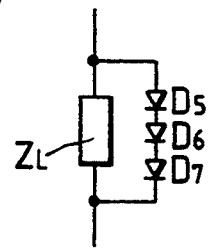
FIG. 9 is a partial circuit diagram showing a preamplifier according to a modification of the preamplifier of FIG. 1.
Figure 10A:
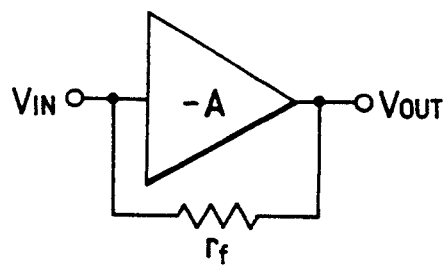
FIGS. 10(a) and 10(b) are circuit diagrams showing two general types of preamplifiers.
Figure 10B:
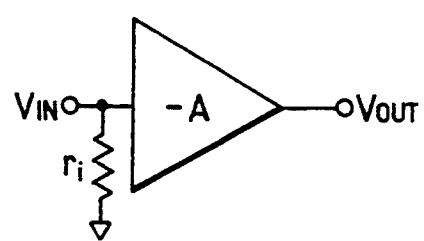
Figure 11:
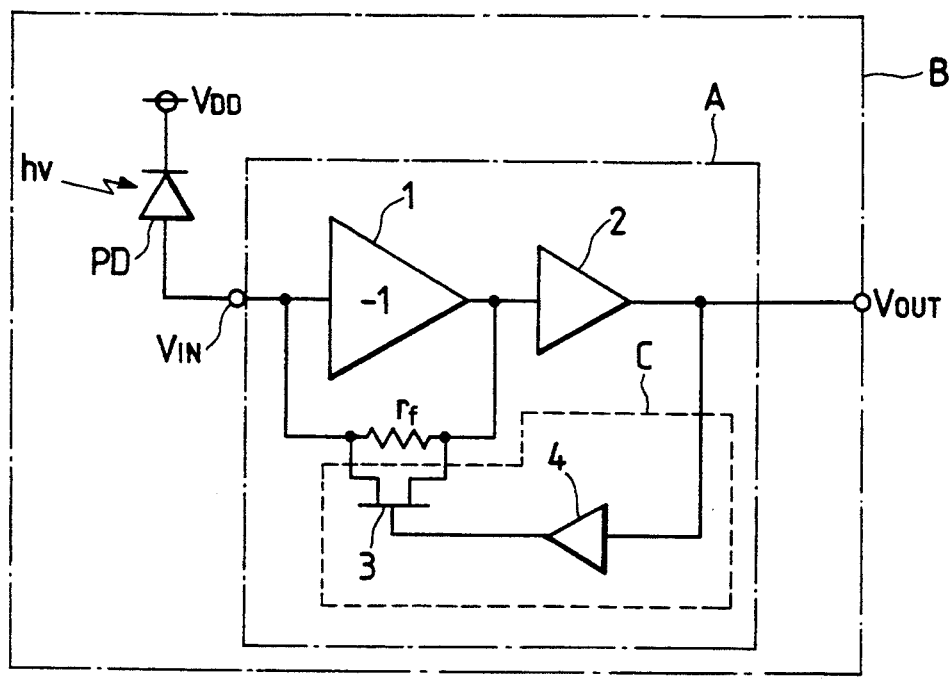
FIG. 11 is a circuit diagram showing general constitution of a first conventional preamplifier.

FIG. 9 is a partial circuit diagram showing a modification of the general circuit diagram of FIG. 1. In this modification, the gain control means is a series connection of diodes $D_5$–$D_7$. This simplified gain control means has the function similar to that in FIG. 1. The number of diodes may be set suitably to provide a desired gain control function.

Further, in the general circuit diagram of FIG. 1, the supply voltage $V_{BB}$ may be changed in accordance with the input signal $V_{IN}$.

As described above, according to the invention, the increase of the frequency bandwidth of the internal amplifier enables the provision of the preamplifier that has a wide dynamic range and operates stably. As a result, it becomes possible to provide optical communication receivers which are highly sensitive and capable of receiving wide-dynamic-range optical signals, and which therefore can accommodate various light sources, wide-range transmission distance, signal attenuation in optical fibers and communication network topology, etc. The invention can suitably applied to preamplifiers using GaAs MESFETs, whereby high-speed optical communication receivers can be realized.

What is claimed is:

1. A preamplifier for optical communication that amplifies an input signal produced by a photodetector, comprising:
   a phase-inverting amplifier including an input-state FET and a load thereof, for amplifying the input signal;
   gain control means for increasing a bandwidth for the preamplifier so that the preamplifier bandwidth remains wider than a bandwidth of an optical receiver which includes the preamplifier, the increase being achieved by reducing an effective load resistance to lower an open-loop gain of the phase-inverting amplifier when a current flowing through the load exceeds a first predetermined value;
   a feedback resistor provided in a negative feedback path of the phase-inverting amplifier; and
   bypass means for reducing an effective feedback resistance when a feedback quantity exceeds a second predetermined value.

2. The preamplifier of claim 1, wherein the gain control means comprises a gain-control FET, a source and a drain of the gain-control FET being connected to respective terminals of the load, and a gate of the gain-control FET being biased at a constant voltage.

3. The preamplifier of claim 1, wherein the gain control means comprises a diode provided in parallel with the load.

4. The preamplifier of claim 1, wherein the bypass means comprises a diode which is provided in parallel with the feedback resistor.

5. A preamplifier for optical communication that amplifies an input signal produced by a photodetector, comprising:
   a phase-inverting amplifier including an input-state FET and a load thereof, for amplifying the input signal;
   gain control means for reducing an effective load and resistance to lower an open-loop gain of the phase-inverting amplifier when a current flowing through the load exceeds a first predetermined value;
   a feedback resistor provided in a negative feedback path of the phase-inverting amplifier; and
   bypass means for reducing an effective feedback resistance when a feedback quantity exceeds a second predetermined value, wherein the bypass means comprises an enhancement-type FET, a drain and a gate of the enhancement-type FET being connected to one terminal of the feedback resistor and a source of the enhancement-type FET being connected to the other terminal of the feedback resistor.

6. A preamplifier for optical communication that amplifies an input signal produced by a photodetector, comprising:
   a phase-inverting amplifier including an input-state FET and a load thereof, for amplifying the input signal;
   gain control means for reducing an effective load resistance to lower an open-loop gain of the phase-inverting amplifier when a current flowing through the load exceeds a first predetermined value;
   a feedback resistor provided in a negative feedback path of the phase-inverting amplifier; and
   bypass means for reducing an effective feedback resistance when a feedback quantity exceeds a second predetermined value, wherein the bypass means comprises a depletion-type FET, a drain and a source of the depletion-type FET being connected to respective terminals of the feedback resistor, and a gate of the depletion-type FET being biased at a constant voltage.

7. A preamplifier for optical communication that amplifies an input signal produced by a photodetector, comprising:
   a phase-inverting amplifier including an input-state FET and a load thereof, for amplifying the input signal;
   gain control means for reducing an effective load resistance to lower an open-loop gain of the phase-inverting amplifier when a current flowing through the load exceeds a first predetermined value;
   a feedback resistor provided in a negative feedback path of the phase-inverting amplifier; and
   bypass means for reducing an effective feedback resistance when a feedback quantity exceeds a second predetermined value, wherein the bypass means comprises a depletion-type FET, a drain and a source of the depletion-type FET being connected to respective terminals of the feedback resistor, and a gate of the depletion-type FET being controlled by an output signal of the phase-inverting amplifier.

8. A preamplifier for optical communication that amplifies an input signal produced by a photodetector, comprising:

a phase-inverting amplifier including an input-state FET and a load thereof, for amplifying the input signal;

voltage dividing means for dividing an output signal of the phase-inverting amplifier;

gain control means for reducing an effective load resistance to lower an open-loop gain of the phase-inverting amplifier when a current flowing through the load exceeds a first predetermined value;

a feedback resistor provided in a negative feedback path of the, phase-inverting amplifier; and bypass means for reducing an effective feedback resistance when a feedback quantity exceeds a second predetermined value, wherein the bypass means comprises a depletion-type FET, a drain and a source of the depletion-type FET being connected to respective terminals of the feedback resistor, and a gate of the depletion-type FET being controlled by the divided output signal of the voltage dividing means.

9. The preamplifier of claim 8, wherein the voltage dividing means comprises a FET for source-following the output signal, and resistors for dividing the source-followered output signal.

10. The preamplifier of claim 8, wherein the voltage dividing means comprises a FET for source-following the output signal, and a second depletion-type FET, a gate and a source of the second depletion-type FET being connected to each other and a drain of the second depletion-type FET being connected to a source of the source-following FET.

11. The preamplifier of claim 9, wherein the voltage dividing means comprises a second depletion-type FET provided in parallel with one of the resistors, a gate and a source of the second depletion-type FET being connected to each other, and the divided output signal appearing at a drain of the second depletion-type FET.

12. The preamplifier of claim 1, wherein FETs used in the phase-inverting amplifier and the bypass means are GaAs MESFETs.

* * * * *